US006282457B1

(12) United States Patent
Miura et al.

(10) Patent No.: US 6,282,457 B1
(45) Date of Patent: Aug. 28, 2001

(54) DEVICE FOR CONTROLLING TREATING STATION

(75) Inventors: Yoshikatsu Miura, Tokyo; Masaya Nagata; Junji Harada, both of Kumamoto, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/202,040
(22) PCT Filed: Jun. 5, 1997
(86) PCT No.: PCT/JP97/01903
§ 371 Date: Dec. 7, 1998
§ 102(e) Date: Dec. 7, 1998
(87) PCT Pub. No.: WO97/47032
PCT Pub. Date: Dec. 11, 1997

(30) Foreign Application Priority Data

Jun. 7, 1996 (JP) .................................................. 8-168408

(51) Int. Cl.[7] .................................................. G06F 19/00
(52) U.S. Cl. ................................ 700/121; 700/3; 700/8
(58) Field of Search .................................. 700/121, 3, 2, 700/9, 96, 112, 8

(56) References Cited

U.S. PATENT DOCUMENTS

| 4,731,733 | * | 3/1988 | Knoll | 700/56 |
| 4,754,427 | * | 6/1988 | Okayama | 700/3 |
| 5,289,365 | * | 2/1994 | Caldwell et al. | 700/9 |
| 5,448,470 | * | 9/1995 | Nishihata et al. | 700/2 |
| 5,583,754 | * | 12/1996 | Leonhardt et al. | 700/3 |
| 5,668,716 | * | 9/1997 | Otomo | 700/2 |
| 5,754,780 | * | 5/1998 | Asakawa et al. | 709/208 |

FOREIGN PATENT DOCUMENTS

| 634 783 A1 | 1/1995 | (EP) . |
| 5-62873 | 3/1993 | (JP) . |
| 6-196544 | 7/1994 | (JP) . |
| 8-110805 | 4/1996 | (JP) . |
| 8-172036 | 7/1996 | (JP) . |
| 8-203811 | 8/1996 | (JP) . |

OTHER PUBLICATIONS

Shibayama, et al., "Laboratory and Factory Automation for VLSI Development and Mass Production (Invited)", International Electron Devices Meeting, San Francisco, Dec. 11–14, 1988, Dec. 11, 1988, IEEE, XP000013924, pp. 736–739.

* cited by examiner

Primary Examiner—William Grant
Assistant Examiner—Edward F. Gain, Jr.
(74) Attorney, Agent, or Firm—Pillsbury Winthrop LLP

(57) ABSTRACT

A control section 20 incorporated in a coating/developing unit 2 is connected to a host computer 4, while a control section 30 incorporated in an exposure unit 3 is connected to the control section 30 of the coating/developing unit 2. Communication with the host computer 4 is performed by the coating/developing unit 2. The control of transfer of a wafer between the coating/developing unit and the exposure unit is executed using a timing signal which is independent of a process instruction output from the host computer 4. The host computer controls the coating/developing unit and the exposure unit using the control section of the coating/developing unit. Supply of instructions to the exposure unit 3 or collection of information therefrom is centrally controlled on the coating/developing unit 2 side.

10 Claims, 8 Drawing Sheets

| IDENTIFICATION CODE | COATING, DEVELOPING RECIPE CONTENTS | IDENTIFICATION CODE | EXPOSURE RECIPE CONTENTS |
|---|---|---|---|
| IC1 | COATING, DEVELOPING RECIPE 1 PROCESS TYPE CONTENS<br>✻✻✻  ☐☐☐<br>✻✻✻  ○○○ | IS1 | EXPOSUR RECIPE 1 PROCESS TYPE CONTENTS<br>✻✻✻  ☐☐☐<br>✻✻✻  ○○○ |
| IC2 | COATING, DEVELOPING RECIPE 2 | IS2 | EXPOSURE RECIPE 2 |
| ⋮ | ⋮ | ⋮ | ⋮ |
| ICn | COATING, DEVELOPING RECIPE n | ISn | EXPOSURE RECIPE n |

FIG. 6

DEVICE FOR CONTROLLING TREATING STATION

This application is the national phase of international application PCT/JP97/01903 filed Jun. 5, 1997 which designated the U.S.

TECHNICAL FIELD

This invention relates to a processing station control apparatus for controlling a processing system which combines, for example, a coating/developing unit and an exposure unit.

BACKGROUND ART

A semiconductor manufacturing process includes steps of coating the surface of a semiconductor wafer with a resist, then exposing and developing the wafer, thereby forming a mask corresponding to a predetermined pattern. These steps require connection of a coating/developing unit and an exposure unit in accordance with development of FA and enlargement of the diameter of wafers. The reason why the coating/developing unit is separated from the exposure unit will be explained below.

Light, X-rays, electron beams, ion beams, etc. are considered pattern information transmission mediums used in an exposure step. Different types of exposure units must be used depending upon the types of mediums or patterns. On the other hand, in the coating/developing process, different steps can be dealt with by changing the types of resists or developers or changing the treatment period of, for example, baking. Concerning the hardware structure, there are lots of sections which can be commonly used, and hence a single apparatus can be commonly used for the different steps. This being so, the coating/developing unit is not formed integral with the exposure unit and has a separate structure from it.

Each of the coating/developing unit and the exposure unit includes a control unit such as a personal computer, through which start of the units, start of the input of a lot, or input of a recipe can be instructed manually. In a semiconductor manufacturing factory, multiple pairs of coating/developing units and exposure units are installed on a single floor, and controlled by a host controller.

In the conventional structure for performing such control, plural pairs, e.g. six pairs, of coating/developing units and exposure units are connected to plural remote controllers, which are connected to a host computer for controlling the entire floor. Each unit of each pair is connected to a corresponding remote controller by connecting the interface of a control unit (personal computer) incorporated in the unit, to a corresponding remote-controller-side interface using a cable.

Each remote controller stores, in relation to respective identification codes, pairs of recipes which are combinations of recipes (process recipes) for coating/developing treatments and those for exposure treatments. When the remote controller has received identification codes from the host computer, or when identification codes have been manually input through the operation panel, the remote controller selects the pair of a coating/developing recipe and an exposure recipe which corresponds to the identification codes, thereby downloading the recipes to the coating/developing unit and the exposure unit, respectively.

Each unit of each pair can be controlled by manually operating a corresponding operation panel to set or instruct a process step. In the case of using a remote controller, it supplies corresponding units with a start instruction, an instruction to switch lots or to exchange reticles, and selected coating/developing and exposure recipes. These units, in turn, supply the remote controller with information concerning the degree of advancement of process, process results, alarm output, etc. Moreover, the control unit of the coating/developing unit is connected to that of the exposure unit by a cable for transmitting a timing signal for wafer transfer. In other words, when a wafer is transferred by transfer means between each pair of units, a timing signal is supplied from one of the units to the other, so that a transfer unit on the coating/developing unit side, a transfer robot on the exposure unit side and a transfer robot located therebetween can operate in a predetermined sequence, thereby enabling automatic transfer of a wafer between the units. The timing signal is supplied when each robot operates.

The conventional central control apparatus, however has the following problems:

(1) It is difficult to perform fine control since the amount of processing load on the remote controller is great because of a great amount of communication. More specifically, since the remote controller centrally controls multiple coating/developing units and exposure units, the amount of communication and the load of processing will become great if the remote controller fetches detailed information on, for example, the position of each wafer and outputs a control command to each unit. On the other hand, in the coating, exposing and developing steps, a time (a tact time) required from the end of a step to the start of the next step must be entirely strictly controlled. Where a fine treatment of an order of, for example, 0.25 $\mu$m is performed using a chemical amplification resist and i-ray exposure, it is necessary to strictly control the treatment time from the end of exposure to pre-baking. In this case, the remote controller must periodically fetch information on the position of each wafer, by communication, from the coating/developing unit and exposure unit, and output appropriate control instructions. This is a great load on the remote controller.

Further, the coating/developing treatments and exposure treatment are carried out on the basis of coating/developing and exposure recipes which correspond to the type of each wafer. A recipe used in each unit is changed by downloading a new one from the remote controller to the unit. Since one recipe, particularly an exposure recipe, contains lots of information such as exposure amount, wavelength, exposure period of time, etc., downloading of the recipe from the remote controller side to each exposure unit requires execution of a great amount of communication, which means extreme inefficiency.

In addition, lots of connection cables are provided between the remote controller and each unit. Including cables between the remote controller and the host computer, a great number of cables are arranged on the entire floor, which may interrupt the work on the floor and degrade the reliability of the system. Furthermore, if the remote controller breaks down, the coating/developing units and the exposure units under its control will inevitably break down.

This invention is aimed at providing a control apparatus for a processing system, which can enhance the efficiency of the entire system and easily perform fine control of components in each processing station.

DISCLOSURE OF INVENTION

The invention provides a processing station control apparatus for use in a processing system in which a to-be-processed object is subjected to a first process in one of first and second processing stations, and then to a second process in the other of the first and second processing stations, comprising: a first control section connected to a host computer for controlling the process performed in the first processing station, in accordance with a process instruction from the host computer; a second control section connected to the first control section for controlling the process performed in the second processing station, in accordance with the process instruction transmitted via the first control section; and a third control section for generating transfer control information which is independent of the process instruction, and controlling transfer of the to-be-processed object between the first and second processing stations, in accordance with the transfer control information.

In this invention, the first control section includes: a process instructing section for fetching the process instruction from the host computer, thereby controlling the first processing station and supplying the second control section with an instruction corresponding to the process instruction, the process instructing section also fetching, from the second control section, status information concerning the second processing station; and a status informing section for fetching, from the second control section, the status information concerning the second processing station, and supplying the host computer with the status information concerning the second processing station, together with status information concerning the first processing station; and the second control section includes: a process instructing section for outputting a process instruction to each component of the second processing station on the basis of the process instruction input from the first control section; and a status informing section for supplying the first processing station with the status information concerning the second processing station.

The processing system includes, as an example, a system which performs pre-processing of the to-be-processed object in the first processing station, then transfers the to-be-processed object to the second processing station to perform intermediate processing of the to-be-processed object, and transfers the to-be-processed object to the first processing station to perform post-processing of the to-be-processed object. For example, the system is a combination of a coating/developing unit for performing coating/developing processing of the object and an exposure unit for exposing it.

In the invention, the operation of the first control section to fetch information concerning the positions of wafers in the coating/developing unit and the exposure unit, and then to supply the second control section with an instruction for controlling the tact time of each wafer is exemplified as the operation to transmit the process instruction between the first and second control sections, and to send the status information.

Concerning the manner of communication, the destination of the process instruction to be sent from the host control section to the first control section may be the first processing station, irrespective of whether the process instruction relates to the first processing station or to the second processing station.

Also, the invention may be modified such that a mode selecting section for selecting one of auto mode and manual mode is provided; that the destination of the process instruction sent from the host control section to the first control section is the first processing station, irrespective of whether the process instruction relates to the first processing station or to the second processing station, when the auto mode is selected; and that the destination of the process instruction sent from the host control section to the first control section is the second processing station when the manual mode is selected and the process instruction relates to the second processing station.

Furthermore, in the invention, an identification code corresponding to a recipe may be sent from the host control section to the first control section, instead of the contents of the recipe. In this case, the first control section includes: a storage section which stores a first recipe group used for performing processing in the first processing station and a second recipe group used for performing processing in the second processing station, such that the first and second recipe groups are related to identification codes; and recipe selecting means for selecting, from the first and second recipe groups, first and second recipes corresponding to identification codes input from the host control section, and sending the selected second recipe to the second control section.

The invention may be constructed such that before a first one of to-be-processed objects of a certain type is transferred from the first processing station to the second processing station, the first control section sends a second processing recipe corresponding to the certain type to the second control section. The invention may be also modified such that a mode selecting section for selecting one of auto mode and manual mode is provided, and that when the auto mode is selected, a second recipe is selected from the storage section of the first control section on the basis of an identification code from the host control section, while when the manual mode is selected, the contents of a second recipe are sent from the host control section to the second control section via the first control section.

BRIEF DESCRIPTION OF THE DRAWINGS

FIG. 6 is a view, useful in explaining an image stored in a memory incorporated in a second control section, in which image recipes and identification codes are related to each other;

BEST MODE OF CARRYING OUT THE INVENTION

Figure 1:
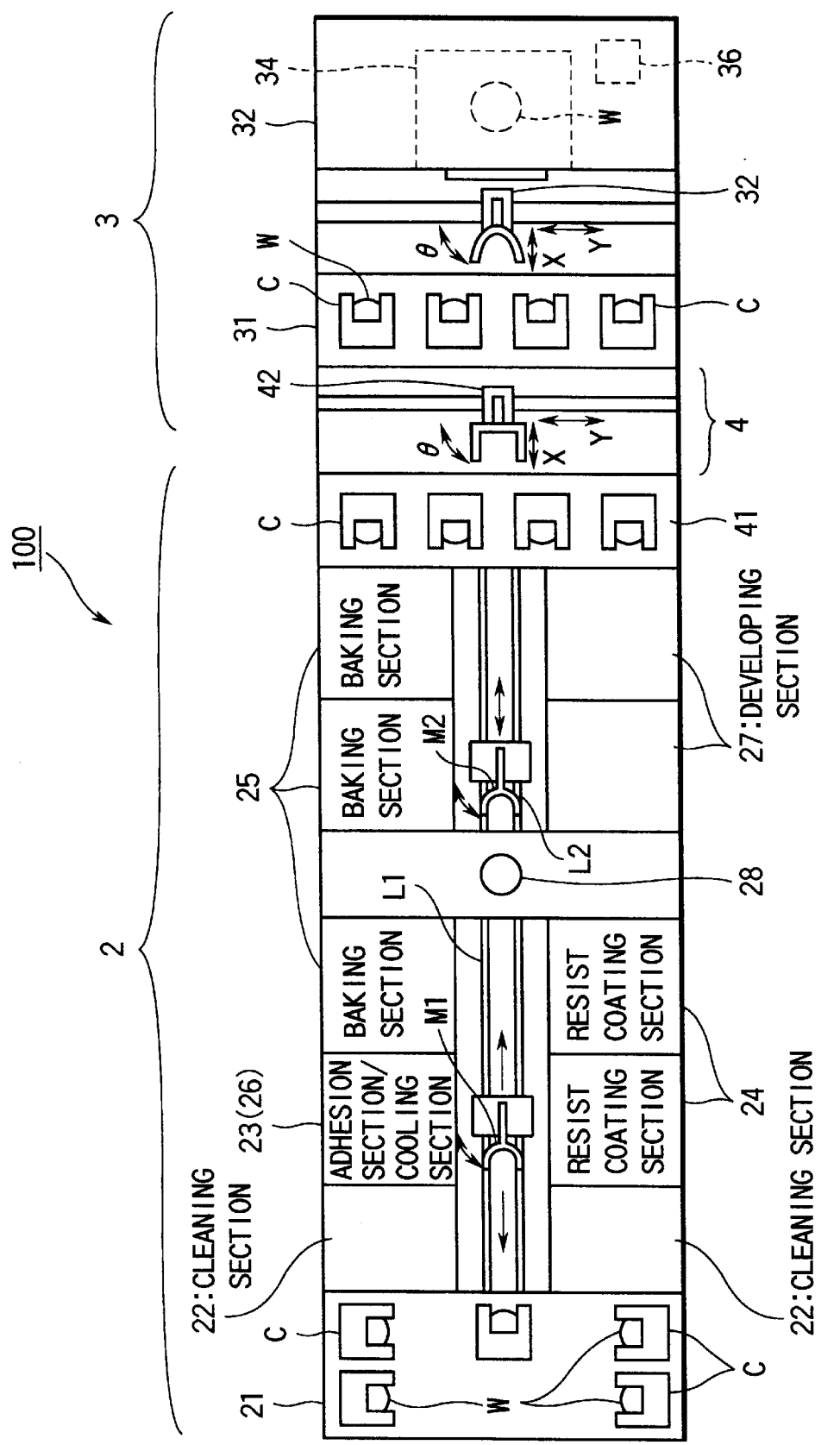
FIG. 1 is a schematic plan view, showing the entire processing system according to the embodiment of the invention.
Figure 2:
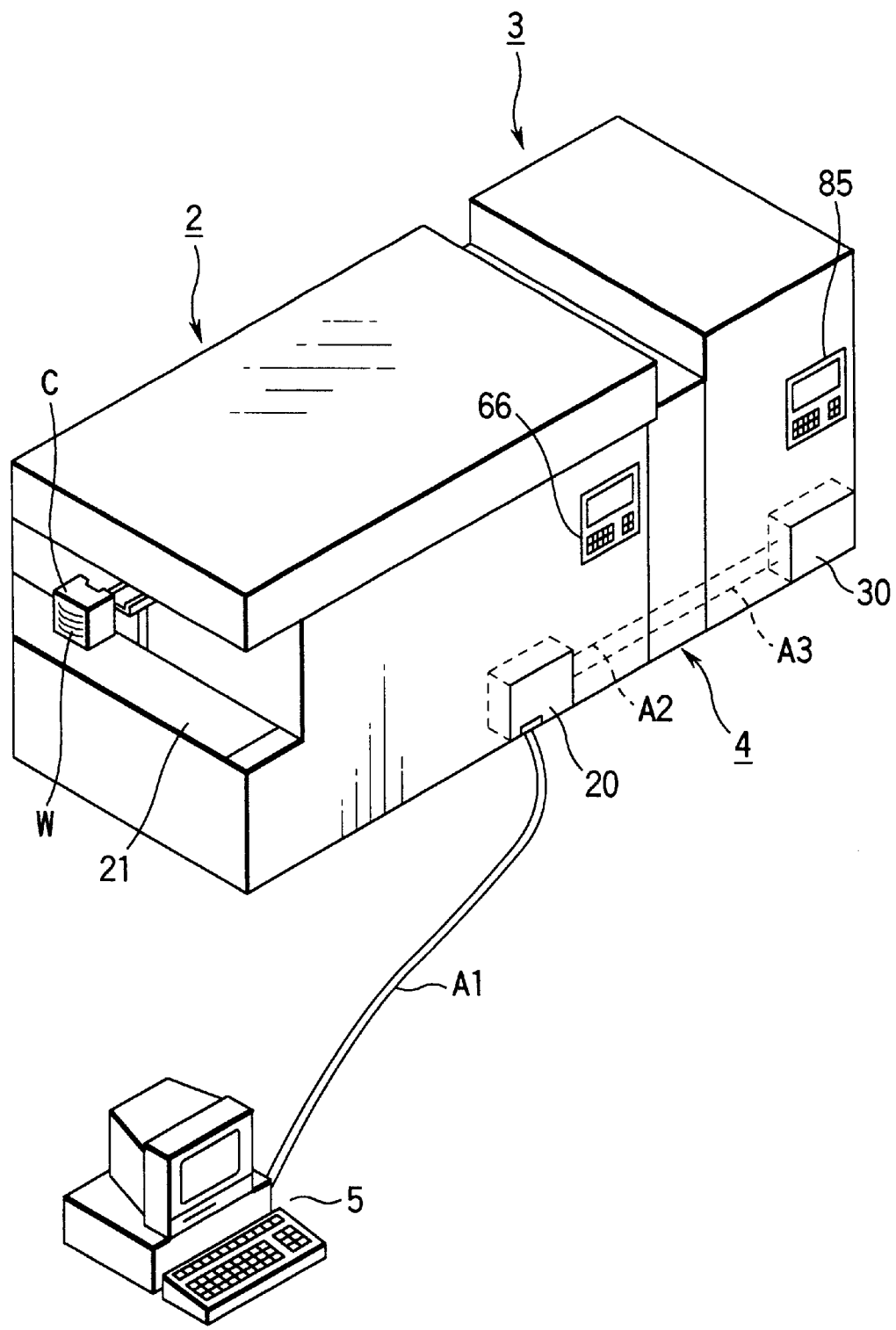
FIG. 2 is a schematic perspective view, showing the entire processing system according to the embodiment of the invention.
Figure 3:
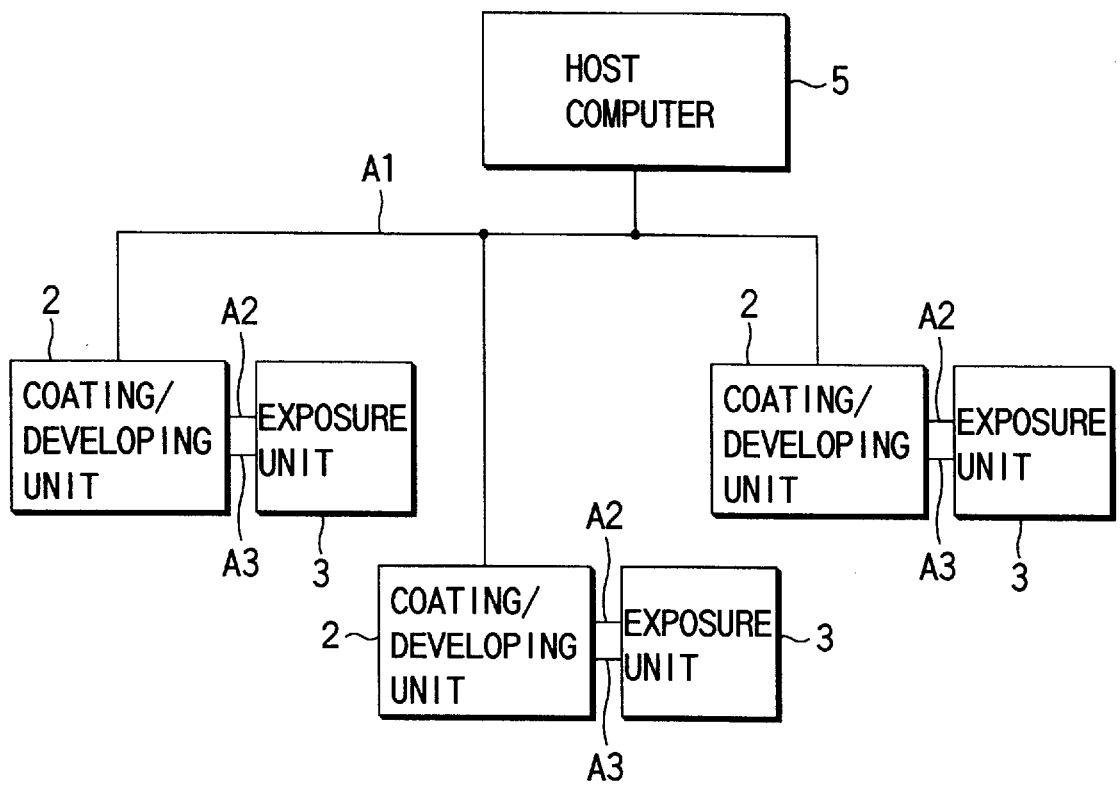
FIG. 3 is a view, useful in explaining the structure of connection for communication performed by a control unit according to the embodiment of the invention.

Referring to FIGS. 1–3, a control unit for a processing station, according to the embodiment of the invention, will be described in detail.

A processing system 100 comprises a coating/developing unit 2 for coating a semiconductor wafer W as a to-be-processed object with a resist solution sensitive to an electron beam, and developing the wafer W after an exposure process; an electron beam exposure unit 3 for radiating the wafer W, on which a resist film is formed by the coating/developing unit 2, with an electron beam to perform the exposure process; and a transfer unit 4 for transferring the wafer W between the coating/developing unit 2 and the electron beam exposure unit 3. In this embodiment, the coating/developing unit 2 and the exposure unit 3 correspond to first and second processing stations, respectively.

This embodiment is characterized in the following points: To concentrically control the coating/developing unit and the exposure unit using a host computer, a control section 20 (see FIG. 2) incorporated in the coating/developing unit 20 is connected to, for example, a host computer 5 as shown in FIGS. 2 and 3, while a control section 30 incorporated in the exposure unit 3 is connected to the control section 20 of the coating/developing unit 2 but not to the host computer 5. Thus, communication with the host computer 5 is performed by the coating/developing unit 2, which means that the host computer 5 considers as if the units 2 and 3 are formed as a single unit, and that instructions to the exposure unit 3 or information thereon is centrally controlled on the coating/developing unit 2 side.

First, the structure and the flow of processing of the units 2 and 3 will be described briefly. The coating/developing unit 2 has an aggregate structure, which includes a loader section 21 for loading and unloading the wafer W; a cleaning section 22 for cleaning the wafer W; an adhesion section 23 for imparting a hydrophobic property to the surface of the wafer W; a resist coating section 24 having a function for coating the wafer W with a resist solution and removing an extra portion of the resist solution from a wafer edge portion by a side rinse treatment; a bake section 25 for heating the wafer W before and after the resist coating to thereby perform pre-bake and post-bake treatments; a cooling section 26 located below the adhesion section 23 for cooling the wafer W to a predetermined temperature; and a developing section 27 having a function for developing the wafer W obtained after the exposure treatment by the electron beam exposure unit 3, and rinsing the developed resist pattern.

In a center portion of the resist coating/developing unit 2, there is a passage which is longitudinally divided into transfer passages L1 and L2 provided with movable main arms M1 and M2, respectively. The process sections 22–27 are located on the opposite sides of the main transfer passages L1 and L2, and a stand-by table 28 is provided between the main transfer passages L1 and L2 for transferring the wafer W between the main transfer arms M1 and M2.

Moreover, a cassette stage 41 is provided at an end of the resist coating/developing unit 6 close to the exposure unit 3, while a cassette stage 31 is provided on the exposure unit 3 side. A transfer unit 4, which is interposed between the cassette stages 41 and 31, has a cassette transfer arm 42 movable in X, Y, Z and θ directions for transferring a cassette C which contains wafers W.

Figure 4:
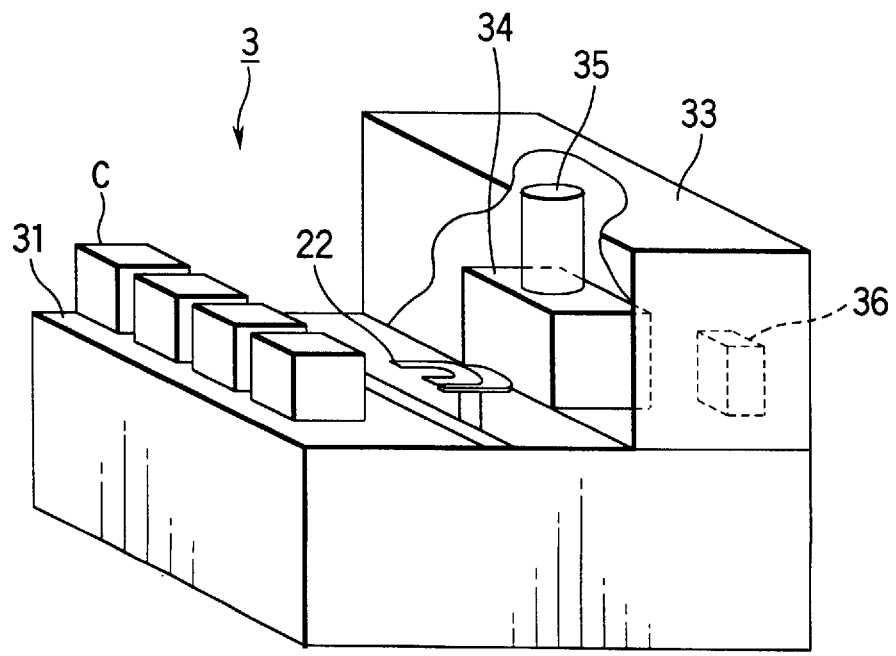
FIG. 4 is a schematic perspective view, showing an exposure unit.

As is also shown in FIG. 4, the exposure unit 3 includes the cassette stage 31, a wafer transfer arm 32 and an exposure section 33. The exposure section 33 has, for example, a vacuum container 34 provided with projection optics, a reticle stage, an exposure stage, etc.; an electron gun 35 for applying an electron beam to a wafer W contained in the vacuum container 34; and a reticle container 36 containing a reticle.

In the above-described processing system, wafers W are taken by the main transfer arm M1 out of the cassette C of the resist coating/developing unit 2, which contains to-be-processed wafers W, and sequentially transferred into the process sections 22–26 located on the opposite sides of the main transfer passage L1. After subjected to a resist coating treatment, the wafers are transferred to the other main transfer arm M2 via the standby table 28, and received in each cassette C on the cassette stage 41. The cassette C is shifted from the cassette stage 41 to the cassette stage 31 of the exposure unit 3 by means of the cassette transfer arm 42. Thereafter, the wafer W are transferred into the exposure section 33 by the transfer arm 32 in a predetermined processing order, where they are subjected to an exposure treatment.

To transfer treated wafers W from the exposure section 33 into the coating/developing unit 2, the transfer arm 32 receives the wafers W and returns them into the cassette C, thereby transferring the wafers to the other main transfer arm M2 via the cassette transfer arm 42 and the cassette stage 41. The wafers may be transferred one by one between the coating/developing unit 2 and the exposure unit 3, instead of transfer performed in units of one cassette.

After transferred into the developing unit 27 by the main transfer arm M2 and subjected to a developing treatment therein, the wafers W are transferred to the main transfer arm M1 via the standby table 28, then into the cassette C located in the loader section 21 for receiving treated wafers.

The above-described transfer system is not controlled by the host computer, but by a central processing unit 7 which performs software switching and generates predetermined driving signals. In other words, the host computer does not output recipe information for the control of the transfer system, which means that the transfer system operates independent of the host computer.

Figure 5:
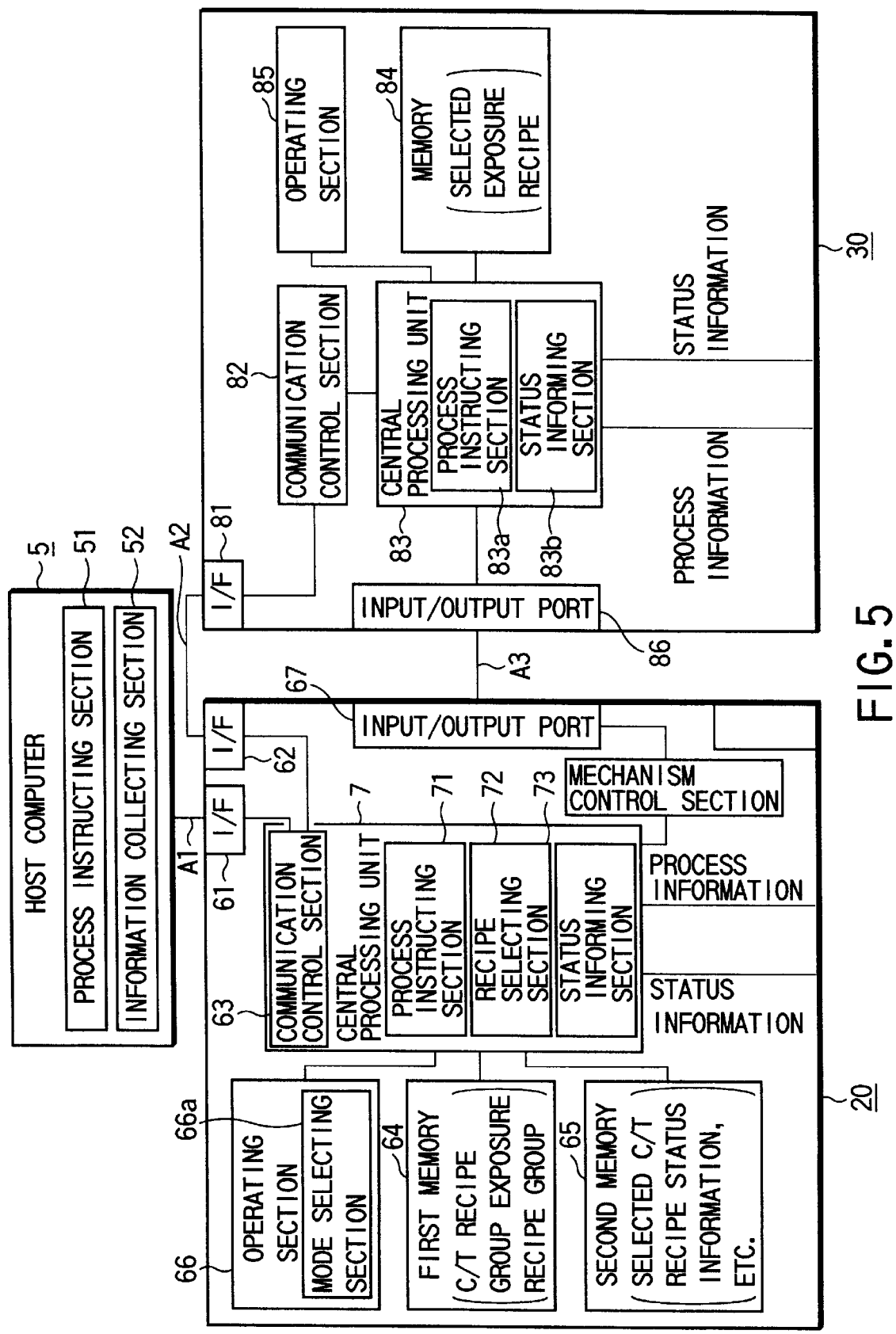
FIG. 5 is a view, showing the entire structure of the control unit according to the embodiment of the invention.

Referring then to FIG. 5, the control unit for the above-described processing system will be described.

The first control section 20 of the coating/developing unit 2 is connected to the host computer 5 via an interface 61, and also to the second control section 30 of the exposure unit 3 via an interface 62. A communication cable Al of an RS232C system, for example, is used for the connection. The control section 20 or 30 is constituted of, for example, a personal computer. The interfaces 61 and 62 are connected to a communication control section 63, which is connected to the central processing unit 7.

The central processing unit 7 is provided with a process instructing section 71, a recipe selecting section 72 and a status informing section 73, and connected to first and second memories 64 and 65 as storage sections. The process instructing section 71 has a function for, for example, outputting instructions to the coating/developing unit 2 and the exposure unit 3 on the basis of instructions from the host computer 5, e.g. instructions to start the processing, to switch the wafers or to change the lot.

The recipe selecting section 72 has a function for selecting, from the group of recipes stored in the first memory 64, a treatment recipe (hereinafter simply referred to as a "recipe") corresponding to an identification code output from the host computer 5. The status informing section 73 has a function for informing the host computer 5 of the status of the coating/developing unit 2 and the exposure unit 3 fetched by the second memory 65, for example, informing the same of the start of treatment of a certain lot, or of process results.

The first memory 64 stores recipes (first recipes) used for the coating/developing unit (C/T unit) 2, and recipes (second recipes) used for the exposure unit 3, such that they are related to their respective identification codes. "Recipe" indicates data concerning the procedure, conditions, etc. of each treatment. When the type of treatment is changed, the recipe is changed from one to another. Specifically, in the case of the coating/developing unit, the recipe indicates the processing time required in each section such as the cleaning section 22, the kind of cleaning liquid or developer, the discharge amount of the resist solution, the temperature during baking or cleaning, etc. In the case of the exposure unit, the kind of reticle, the exposure amount, the exposure time, etc.

FIG. 6 shows an image of data stored in the first memory 64. A plurality of first recipes for the coating/developing unit are prepared in accordance with the kinds of treatments, and stored in relation to identification codes IC1–ICn assigned thereto. On the other hand, a plurality of second recipes for the exposure unit are prepared in accordance with the kinds of treatments, and stored in relation to identification codes IS1–ISn assigned thereto.

An operating section 66 comprising a touch screen or a keyboard is connected to the central processing unit 7. The operating section 66 is used to supply the coating/developing unit 2 and the exposure unit 3 with instructions to start their treatments, to instruct to change lots, to set recipes for the coating/developing unit and for the exposure unit, to instruct to examine whether an alien substance is contained in a reticle in the exposure unit 3, or to switch the mode between the inline auto mode and the inline manual mode. In this embodiment, a mode switching section 66a is included in the operating section 66. Moreover, an input/output port 67 is connected to the central processing unit 7 for supplying a timing signal for wafer transfer to the exposure unit 3 side.

The second control section 30 of the exposure unit 2 comprises an interface 81, a communication control section 82, a central processing unit 83, a memory 84, an operating section 85 and an input/output port 86. The interface 81 is connected to the interface 62 of the first control section 20 by means of a communication cable A2 of, for example, an RS232C system. The central processing unit 83 has a process instructing section 83a and a status informing section 83b. The process instructing section 83a has a function for, for example, outputting an instruction to each component of the exposure unit on the basis of a process instruction supplied from the first control section 20 via the cable A2 and the interface 81. The status informing section 83b has a function for informing the coating/developing unit 2 of the status of the exposure unit 3, such as treatment start of a certain lot, treatment results, wafer position, alarm output, etc.

The central processing unit 83 has a function for storing, in the memory 84, the second recipes supplied from the first control section 20 via the interface 81, and the process instructing section 83a outputs an instruction to each component of the exposure unit 3 with reference to the second recipes stored in the memory 84. Concerning the output of process instructions, a sequencer is provided in each module (an individual chamber which forms each process section), the exposure section 33 and the driving section of each transfer system, to which sequencer process instructions are supplied from the process instructing sections 71 and 83a.

The operating section 85 is used to set process conditions of the exposure unit 3, or to input an instruction to start the processing by the unit 3. Although the second control section 30 can control the exposure unit 3, as well as the first control section 20, the operating section 85 is assumed not to be used in the processing performed in the embodiment which uses the inline auto mode and inline manual mode.

The input/output port 86 is connected to the input/output port 67 of the first control section 20 via a signal cable A3. The signal cable A3 is used to send, from the coating/developing unit 2 to the exposure unit 3 or vice versa, a timing signal for enabling the transfer of the cassette C by the cassette arm 42 between the cassette stage 41 on the coating/developing unit 2 side and the cassette stage 31 on the exposure unit 3 side. The transfer operation of the cassette arm 42 is controlled by, for example, the second control section 30 on the basis of the timing signal. In other words, the transfer unit 4 is controlled by a mechanism control section 74 on the basis of a timing signal which is independent of the recipe information output from the host computer 5. More specifically, it is not necessary for the host computer 5 to output recipe information for the transfer unit, while the transfer unit 4 is controlled by the mechanism control section 74 on the basis of a timing signal output from the central processing unit 7 and corresponding to, for example, the positional condition of the unit 4.

The host computer 5 includes, for example, a process instructing section 51 for outputting process instructions to the first control section 20, and an information collecting section 52 for collecting information concerning the conditions of the coating/developing unit 2 and the exposure unit 3 and output from the first control section 20.

Figure 7:
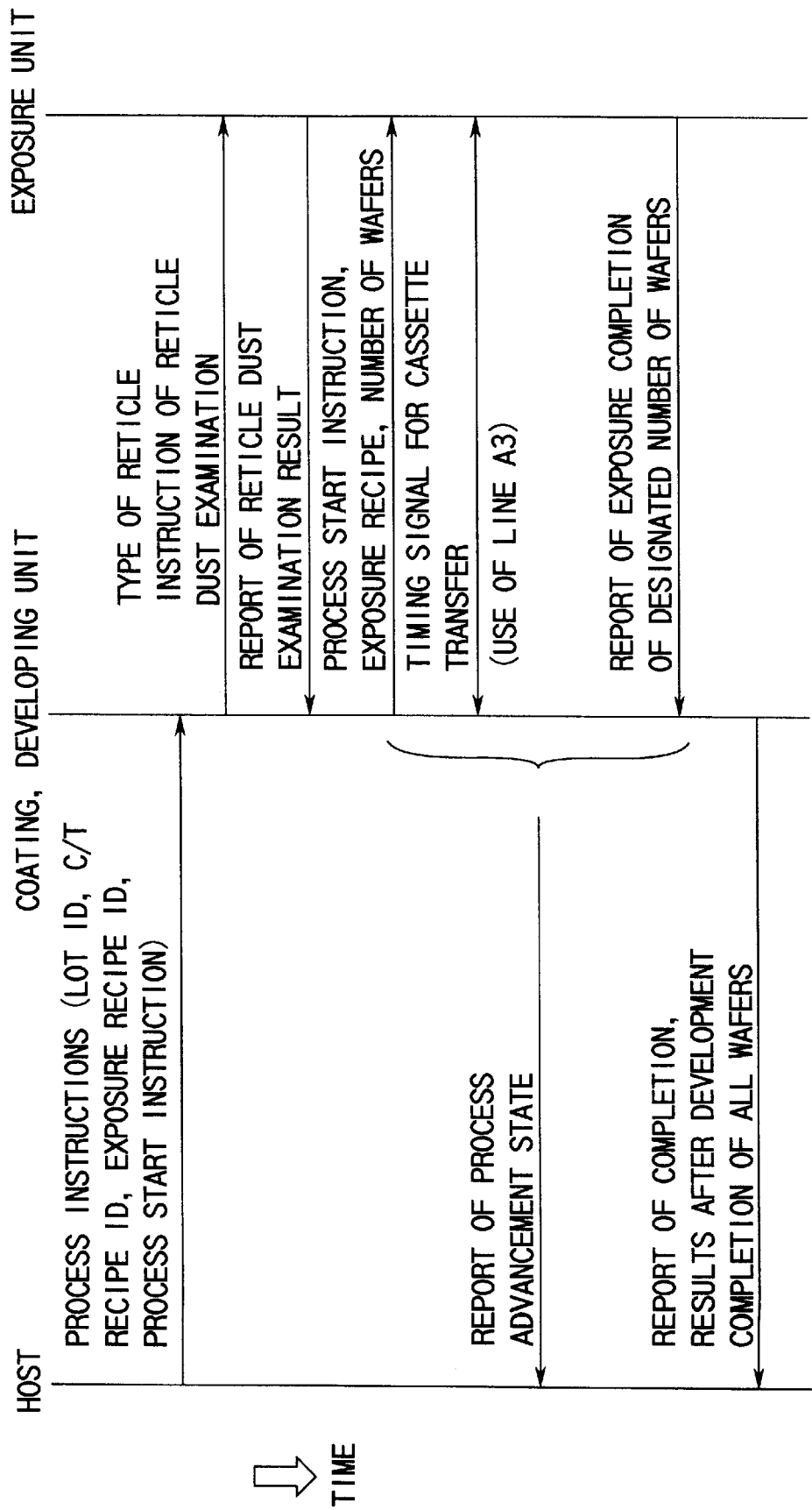
FIG. 7 is a view, useful in explaining communication performed in time sequence between a host computer, a coating/developing unit and an exposure unit.

The operation of the above-described embodiment will be described. Although one of the auto mode and the manual mode is selected as the control mode for a series of treatments performed in the coating/developing unit 2 and the exposure unit 3, the auto mode is selected when mass production is carried out. When the auto mode has been selected, the process instructing section 51 of the host computer 5 supplies the first control section 20 of the coating/developing unit 2 with an instruction to start the processing, an identification code corresponding to a set of wafers to be processed by the processing system 100, identification codes corresponding to recipes for coating/developing and exposing treatments, information concerning the kind of reticle to be used in the exposure unit 3, information as to examination performed at the time of reticle exchange for detecting an alien substance, or information concerning a designated pilot wafer, as is shown in FIG. 7. Since the destination of transmission data (process instruction) at this time is the coating/developing unit 2, the communication control section 63 sends this data to the central processing unit 7. The central processing unit 7 in turn recognizes the lot of wafers to be processed, and the recipe selecting section 72 selects, from the first memory 64, a coating/developing treatment recipe and an exposure treatment recipe corresponding to recipe identification codes output from the host computer 5, thereby storing the selected recipes in the second memory 65, together with each instruction output from the host computer 5.

The pilot wafer indicates the to-be-tested wafer included in a certain lot, which is fetched from the cassette C located on the loader section 21 of the coating/developing unit 2, before the wafers are processed. The pilot wafer is subjected to a series of treatments. If it is determined as a result of observation that the pattern line width of the pilot wafer is deviated from a predetermined value, the recipe is altered, for example, such that the amount of exposure is changed. After such a pilot wafer passes the test, the remaining wafers are processed.

After the treatment of the pilot wafer is finished, an instruction is output from the process instructing section 71 to the sequencer of each component of the coating/ developing unit 2, whereby the above-mentioned series of treatments are performed on the basis of the coating/ developing treatment recipe stored in the second memory 65, and at the same time, various status information items such as wafer position, resist temperature, etc. are output from the components of the coating/developing unit 2 to the status informing section 73 and stored in the memory 65.

On the other hand, the process instructing section 71 of the first control section 20 supplies, via the communication-line A2, the second control section 30 of the exposure unit 3 with information concerning the kind of reticle, information as to examination for detecting reticle dust, an instruction to start processing, information concerning a selected exposure recipe, information concerning the number of processed wafers, etc. On the basis of these information and instructions, the second control section 30 controls each component of the exposure unit 3 so as to perform a series of treatments, collects various conditions such as wafer position, exposure amount, etc. from each component, and sends the collected information to the coating/developing unit 2 via the communication-line A2. The information sent to the coating/developing unit side is stored in the second memory 65.

Further, to transfer the cassette C between the coating/ developing unit 2 and the exposure unit 3, a timing signal is transferred between the central processing units 7 and 83 via the communication-line A3, thereby controlling the cassette arm 42 on the basis of the timing signal. This timing signal is not output from the host computer 5, but independently from the central processing unit 7 in accordance with, for example, the position of the transfer unit, thereby to control the transfer unit 4.

The control section 20 of the coating/developing unit 2 controls each component on the basis of the position information input from the exposure unit 3 side, so that the tact time (the time required from the termination of a certain treatment to the start of the next treatment, and in this case the time required from the termination of the exposure to the start of the development) can be set at a predetermined value.

After the exposure treatment of a designated number of wafers is finished, information indicative of the termination of the exposure treatment, the treatment results, etc. is supplied to the coating/developing unit 2 side from the exposure unit 3 side via the communication-line A2, and stored in the second memory 65. After all wafers included in the designated lot are subjected to the development treatment, the coating/developing unit 2 informs the host computer 5 of the completion. At this time, the status informing section 73 of the first control section 20 informs the host computer 5 of the process results obtained from the coating/developing unit 2 and the exposure unit 3, as well as the completion of the processes. When the lot is switched from one to another, another exposure recipe is stored in the memory 84 of the second control section 30 before a first one of the wafers included in a new lot is transferred into the exposure unit 3. The time before the wafer is transferred into the exposure unit 3 indicates the point of time before, for example, the arm 32 takes the wafer out of the cassette C.

Figure 8:
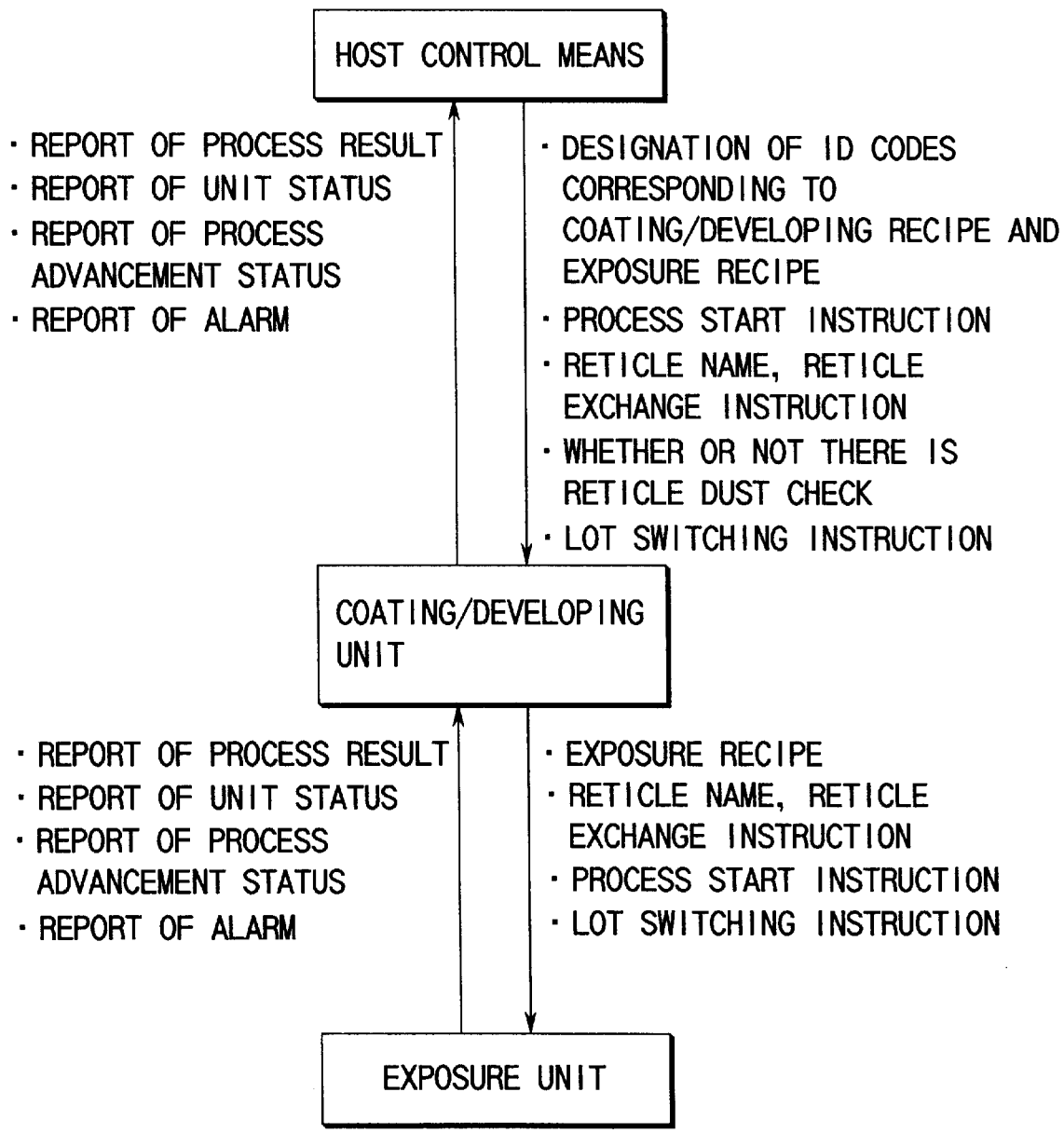
FIG. 8 is a view, useful in explaining the contents of communication performed between the host computer, the coating/developing unit and the exposure unit.

Examples of communication matters between the host computer 5, the coating/developing unit 2 and the exposure unit 3 are shown in FIG. 8. The process results include the ID (identification code) of a processed lot, the process start time, the process termination time, the number of processed wafers contained in the cassette, identification codes assigned to the coating/developing recipe and exposure recipe, reticle dust detection results, process conditions, resist temperature, cooling plate temperature, developer temperature, peripheral exposure illuminance, etc.

The unit status report indicates reporting whether the coating/developing unit 2 is in the off-line state, the idling state or the coating/developing state, and reporting whether the exposure unit 3 is in the off-line state, the idling state, the operator support standby state or the coating/developing state. The process advancement event report indicates report of the completion of cassette transfer in the loader section 21, report of process start (termination), etc. Each time an even occurs, the coating/developing unit 2 side informs the host computer 5 of it.

Figure 9A:
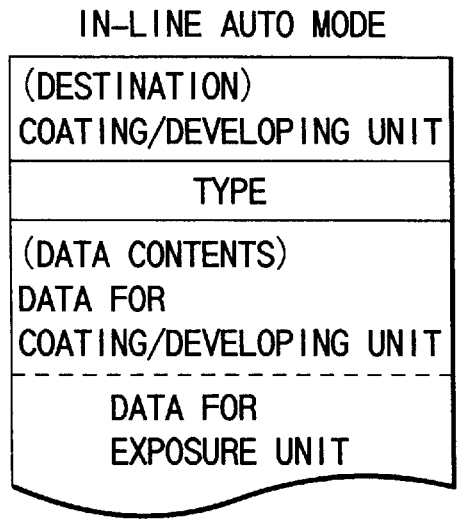
FIGS. 9A and 9B are views, diagrammatically showing communication data.
Figure 9B:
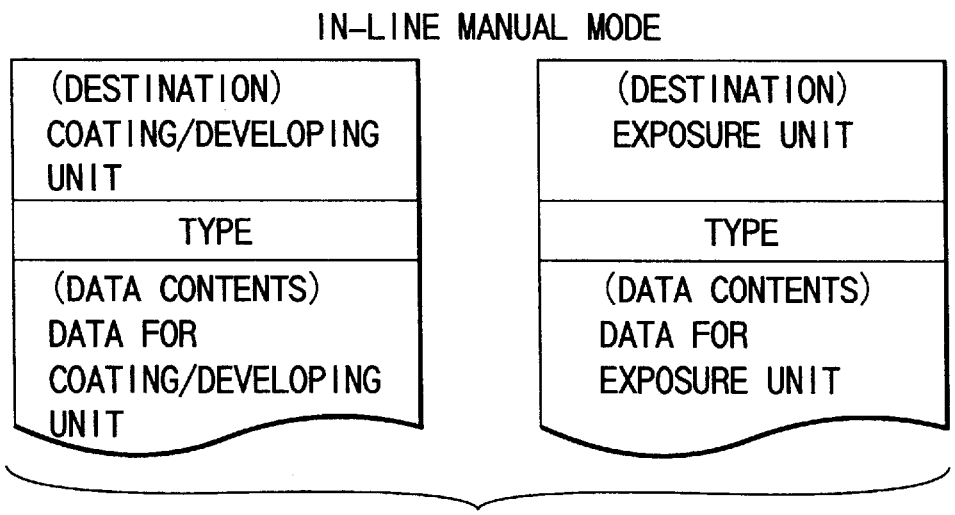

The case of selecting the inline manual mode will be described. In this case, the host computer 5 deals with two units, i.e. the coating/developing unit 2 and the exposure unit 3. Specifically, in the case of the above-described inline auto mode, the destination name of information output from the host computer 5 is only the coating/developing unit 2, while the sender name of information output from the coating/ developing unit 2 to the host computer 5 is only the coating/developing unit 2, as is shown in FIG. 9A. On the other hand, in the inline manual mode, the destination name of information output from the host computer 5 and the sender name of information received by the host computer 5 can be the coating/developing unit 2 and the exposure unit 3.

Where the destination name of information is the exposure unit 3, the information is sent to the second control section 30 via the communication control section 63 of the first control section 20 and the communication-line A2. Where the sender name and destination name of information are the exposure unit 3 and the host computer 5, respectively, the information is sent to the host computer 5 via the communication control section 63. This enables direct control of the exposure unit 3 by the host computer 5.

Moreover, in the inline manual mode, the contents of an exposure recipe is sent from the host computer 5 to the coating/developing unit 2 (more specifically, to the first control section 20) with the exposure unit as an destination. Since in the communication control section 63 of the first control section 20, the destination of the received information is the exposure unit, the information is sent from the interface 62 to the second control section 30 via the communication-line A2. In the case of a coating/developing recipe, its identification code may be sent from the host computer 5 to the first control section 20 as in the auto mode, or the contents of the coating/developing recipe may be sent as in the case of the exposure recipe.

The manual mode is used when the process system is established before its mass production. At the time of establishment, the contents of a recipe may be often adjusted. Therefore, if the contents of the various recipes are assumed to be stored in the first control section 20, a great number of recipes having slightly changed contents must be stored, which is not efficient. Since in particular, the exposure recipe contains lots of contents, it is more efficient to send a recipe from the host computer 5 side, and to send, to the second control section 30 via the first control section 20, the contents of the recipe which have been modified in accordance with process results based on the original contents of the recipe.

In the manual mode, it may be modified such that the contents of the coating/developing recipe are sent from the host computer 5 side, or that the contents of the recipe are sent in the case of the coating/developing recipe, while an identification code corresponding to the recipe is sent in the case of the exposure recipe.

Figure 10:
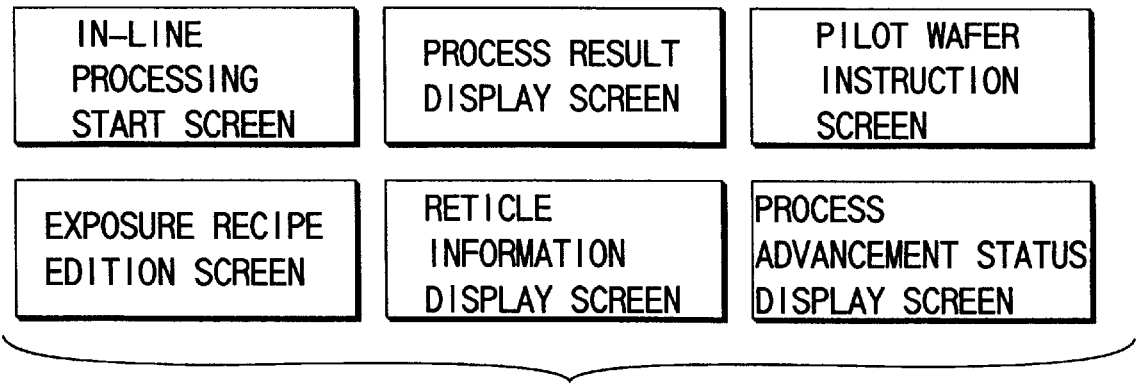
FIG. 10 is a view, useful in explaining the types of operation screens incorporated in the operating section of the coating/developing unit.

The operation section 66 of the first control section 20 will now be described. In this operation section, screens necessary for controlling (in-line controlling) the exposure unit 3 on the coating/developing unit 2 side are prepared in addition to the operation screen of the coating/developing unit 2 itself. Examples of the additional screens is shown in FIG. 10. An inline process start screen is a set screen for centrally controlling the units 2 and 3 on the coating/developing unit 2 side, through which screen the lot, the wafer in the cassette, the coating/developing recipe and the exposure recipe can be designated. A process display screen displays actual coating/developing data and exposure data. Further, the wafer which should be used as a pilot wafer can be designated using a pilot wafer designating screen, and the exposure recipe can be edited using an exposure recipe edition screen. In addition, a reticle information display screen displays reticle dust examination results, and a process advancement status display screen displays, for example, information concerning the position of a wafer.

By virtue of those screens, various types of setting can be performed for the exposure unit 3 in the on-line mode, and also every information item can be grasped in both the on-line mode and the off-line mode. At the time of executing, for example, maintenance operations, various operations can be performed for the exposure unit 3, using the operating section 85 of the exposure unit 3 after releasing the in-line control.

More specifically, the mechanism control section 74 performs mechanical control of the developing/coating unit and wafer transfer control between the unit and the exposure unit, in a manner separate from the central processing unit 7. Concerning the wafer transfer between the developing/coating unit and the exposure unit, the wafer transfer control section incorporated in the mechanism control section 74 is independent of the central processing unit 7. The section 74 detects whether or not there is a wafer, and causes wafer transfer using a status signal A3 for the exposure unit. In other words, even if transfer of exposure recipe information, which is mainly controlled by the communication control section 63, is not realized in this system, wafer transfer is carried out. On the other hand, transfer of the exposure recipe information mainly controlled by the communication control section 63 is independent of the control of the wafer transfer control section, and can be realized even if the transfer control section is not incorporated in this system.

As described above, in the embodiments which employ a system wherein a plurality of pairs of coating/developing units 2 and the exposure units 3 are centrally controlled by the host computer 5, communication between each of the pairs and the host computer 5 is performed on the coating/developing unit 2 side, and each unit pair functions as a single unit with respect to the host computer 5, whereby reception of a process instruction by the coating/developing unit 2 and the exposure unit 3 and sending of status information concerning the units 2 and 3 are performed on the coating/developing unit 2 side. On the other hand, the driving control of the transfer unit 4 is performed using a timing signal which is independent of recipes output from the host computer. The counter operations of the units 2 and 3 when a warning state has occurred, or the control of the tact time based on the position of a wafer is performed by the coating/developing unit 2, while fine control in the units 2 and 3 is centrally performed by the coating/developing unit 2 without communication. The above-mentioned features provide the following advantages:

1) The amount of communication between the host computer 5 and the processing station (the unit 2, 3 side) is reduced, thereby reducing the processing load of the host computer 5.

2) The units 2 and 3 can be finely and efficiently controlled. Since in the case of, in particular, using a chemical amplification resist, the tact time after exposure must be strictly controlled, the above-described control is appropriate. The chemical amplification resist generates an acid from a photosensitive agent contained therein as a result of exposure, which acid diffuses after heating and functions as a catalyst for dissolving a base resin as a main component of the resist or changing its molecular structure to make it soluble or insoluble in a developer. It is necessary to keep the acid away from, for example, the small amount of ammonium contained in the air, and therefore to strictly control the tact time.

Lots of types of exposure units are available which are manufactured so as to deal with various patterns. It is very difficult to centrally control such different types of exposure units, using a remote controller as in the conventional case. Further, it is almost impossible to do fine control such as tact time control. However, such control can be easily realized in the embodiments wherein central control is performed on the coating/developing unit 2 side.

3) The system can show a high reliability since only a small number of communication cables are required in it. Moreover, since no remote controller of a central control type is used, the system is free from the problem that each unit cannot continue its operation when the remote controller breaks down.

4) The host computer 5 sends identification codes corresponding to a coating/developing recipe and an exposure recipe, while each coating/developing unit 2 selects recipe contents corresponding to the identification codes. Accordingly, only a small amount of processing load and communication load is applied to the host computer 5. Further, only a small amount of time is required to load the memory of each unit 2 or 3 with a corresponding recipe for processing since such loading is performed in each unit. In light of these points, too, this system is an efficient one.

5) In the in-line manual mode, the coating/developing unit 2 and the exposure unit 3 are individually controlled by the host computer 5, and the contents of the exposure recipe are supplied from the host computer 5 to the exposure unit 3 side via the coating/developing unit 2. Therefore, when a device trial line or factory is established, an optimal exposure recipe can be easily found by finely modifying the original recipe by the host computer 5. In other words, at the time of such establishment, it is necessary, in particular, to finely adjust exposure recipes. Since each exposure recipe has lots of contents, if the exposure recipes are stored as a data base on the control section 20 side, they will occupy a greater part of the memory capacity of the personal computer. In light of this, it is advantageous to control the recipes on the host computer 5 side. In addition, since the host computer 5 collects status information from the coating/developing unit 2 and the exposure unit 3, and supplies the units 2 and 3 with process instructions corresponding to the information, it can control the units 2 and 3 strictly.

In the invention, the host computer 5 may be connected to the exposure unit instead of the coating/developing unit, such that the units can be centrally controlled by the control section of the exposure unit. If, however, central control is performed on the exposure unit side, a greater amount of communication must be performed between itself and the coating/developing unit, and a great amount of data or programs need to be added to the control section of the exposure unit, since the coating/developing unit performs a greater number of treatments and performs parallel processing of a greater number of wafers than the exposure unit. Accordingly, it is advantageous to construct the system as described in the above embodiments.

In addition, the processing system to which the invention is applied is not limited to the above-described combination of units, but may be a combination of a processing station for performing a single process of to-be-processed objects, and another processing station for performing a successive process of them. However, where as in the above-described embodiments, the system is a combination of a processing station for performing pre-step and post-step treatments, and a processing station for performing an intermediate treatment between the pre-step and post-step treatments, the application of the invention to the system is more advantageous since the position of each to-be-processed object significantly influences the tact time of them. The to-be-processed objects are not limited to wafers, but may be liquid crystal panel substrates.

INDUSTRIAL APPLICABILITY

According to the invention, the entire processing system can be made efficient such that, for example, the system can be operated in a mass production process by just outputting a simple instruction from the host control section, thereby enabling fine control of components in the processing station.

What is claimed is:

1. A control apparatus for use in a processing system in which a to-be-processed object is subjected to a first process in one of upper- and lower-ranking processing units, and then to a second process in the other of the upper- and lower-ranking processing units, said control apparatus comprising:

a first control section connected to a host computer for controlling the process performed in the upper-ranking processing unit, in accordance with a process instruction from the host computer;

a second control section connected to the first control section for controlling the process preformed in the lower-ranking processing unit, in accordance with the process instruction transmitted via the first control section; and a third control section for generating transfer control information which is independent of the host computer between the first and second control sections, and controlling transfer of the to-be-processed object between the upper- and lower-ranking processing units, in accordance with the transfer control information;

wherein the status of the upper-ranking processing unit and the lower-ranking processing unit, the start time of processing a lot, processing results, information on the position of wafers, and alarm output are reported between the first and second control sections; and wherein the first control section includes: a process instructing section for fetching the process instruction from the host computer, thereby controlling the upper-ranking processing unit and supplying the second control section with an instruction corresponding to the process instruction, the process instructing section also fetching, from the second control section, status information concerning the lower-ranking processing unit; and a status informing section for fetching, from the second control section, the status information concerning the upper-ranking processing unit, and supplying the host computer with the status information concerning the lower-ranking processing unit, together with status information concerning the upper-ranking processing unit; and wherein the second control section includes: a process instructing section for outputting a process instruction to each component of the lower-ranking processing unit on the basis of the process instruction input from the first control section; and a status informing section for supplying the upper-ranking processing unit with the status information concerning the lower-ranking processing unit.

2. A control apparatus for use in a processing system in which a to-be-processed object is subjected to a first process in one of upper- and lower-ranking processing units, and then to a second process in the other of the upper- and lower-ranking processing units, said control apparatus comprising:

a first control section connected to a host computer for controlling the process performed in the upper-ranking processing unit, in accordance with a process instruction from the host computer;

a second control section connected to the first control section for controlling the process performed in the lower-ranking processing unit, in accordance with the process instruction transmitted via the first control section; and a third control section for generating transfer control information which is independent of the host computer between the first and second control sections, and controlling transfer of the to-be-processed object between the upper- and lower-ranking processing units, in accordance with the transfer control information;

wherein the status of the upper-ranking processing, unit and the lower-ranking processing unit, the start time of processing a lot, processing results, information on the position of wafers, and alarm output are reported between the first and second control sections; and wherein the processing system performs pre-processing of the to-be-processed object in the upper-ranking processing unit in accordance with the process instruction, then transfers the to-be-processed object to the lower-ranking processing unit to perform intermediate processing of the to-be-processed object, and transfers the to-be-processed object to the upper-ranking processing unit to perform post-processing of the to-be-processed object in accordance with the transfer control information.

3. A control apparatus for use in a processing system in which a to-be-processed object is coated with a resist in a coating/developing unit as an upper-ranking processing unit in accordance with information from a host computer, then is transferred to an exposure unit as a lower-ranking processing unit where the to-be-processed object is subjected to exposure, and is transferred to the coating/developing unit where the to-be-processed object is subjected to development, comprising:

a first control section for receiving recipe information and controlling processing of the coating/developing unit;

a second control section for controlling exposure processing of the exposure unit in accordance with the recipe information transmitted from the host computer via the first control section; and a third control section for controlling transfer of the to-be-processed object between the upper- and lower-ranking processing units in accordance with transfer control information which is independent of the recipe information, the first control section including: a process instructing section for fetching the recipe information from the host computer, thereby controlling coating/developing processing of the coating/developing unit, and supplying the second control section of the exposure unit with an instruction corresponding to the recipe information; and a status informing section for fetching, from the second control section, the status information concerning the exposure unit, and supplying the exposure status information to the host computer, together with status information concerning the coating/developing unit;

the second control section including: a process instructing section for outputting recipe information to each component of the exposure unit on the basis of the recipe information input from the first control section; and a status informing section for supplying the coating/developing unit with the status information concerning the exposure unit.

4. A control apparatus according to claim 3, wherein the first control section is constructed such that it fetches information concerning the positions of to-be-processed objects in the coating/developing unit and the exposure unit, thereby supplying the exposure unit with an instruction for controlling the tact time of each to-be-processed object.

5. A control apparatus according to claim 3, wherein the host computer supplies the upper-ranking processing unit with the recipe information irrespective of whether the recipe information relates to the upper-ranking processing unit or to the lower-ranking processing unit.

6. A control apparatus according to claim 3, wherein the first control section has a mode selecting section for selecting one of auto mode and manual mode, and the host computer sends the recipe information to the upper-ranking processing unit, irrespective of whether the recipe information relates to the upper-ranking processing unit or to the lower-ranking processing unit, when the auto mode is selected, and sends the recipe information to the lower-ranking processing unit when the manual mode is selected and the recipe information relates to the lower-ranking processing unit.

7. A control apparatus for use in a processing system in which a to-be-processed object is subjected, in accordance with a process instruction from a host computer, to a first process in one of upper- and lower-ranking processing units, and then to a second process in the other of the upper- and lower-ranking processing units, comprising:

a first control section for controlling the process performed in the upper-ranking processing unit, in accordance with the process instruction;

a second control section for controlling the process performed in the lower-ranking processing unit, in accordance with the process instruction transmitted from the host computer via the first control section; and a third control section for generating transfer control information which is independent of the host computer between the first and second control sections, and controlling transfer of the to-be-processed object between the upper- and lower-ranking processing units, in accordance with the transfer control information;

and wherein the first control section includes: a storage section which stores a first process recipe group used for performing processing in the upper-ranking processing unit and a second process recipe group used for performing processing in the lower-ranking processing unit, such that the first and second process recipe groups are related to identification codes; and process recipe selecting means for selecting, from the first and second process recipe groups, first and second process recipes corresponding to identification codes input from the host computer, and sending the selected second process recipe to the second control section.

8. A control apparatus according to claim 7, wherein before a first one of to-be-processed objects of a certain type is transferred from the upper-ranking processing unit to the lower-ranking processing unit, a second processing recipe corresponding to the certain type is sent from the first control section to the second control section.

9. A control apparatus according to claim 8, wherein the first control section has a mode selecting section for selecting one of auto mode and manual mode, and a recipe selecting section for selecting, when the auto mode is selected, the second process recipe from the storage section of the first control section on the basis of an identification code from the host computer, the recipe selecting section sending, when the manual mode is selected, the contents of the second process recipe from the host computer to the second control section via the first control section.

10. A control apparatus according to claim 7, wherein the host computer sends the process instruction to the upper-ranking processing unit irrespective of whether the process instruction relates to the upper-ranking processing unit or to the lower-ranking processing unit.

* * * * *